(12) United States Patent
Akutsu

(10) Patent No.: US 7,054,788 B2
(45) Date of Patent: May 30, 2006

(54) MEMORY DEFECT REMEDY ANALYZING METHOD AND MEMORY TEST INSTRUMENT

(75) Inventor: Masahiro Akutsu, Tokyo (JP)

(73) Assignee: Advantest Corporation, Tokyo (JP)

( * ) Notice: Subject to any disclaimer, the term of this patent is extended or adjusted under 35 U.S.C. 154(b) by 14 days.

(21) Appl. No.: 10/399,368

(22) PCT Filed: Nov. 6, 2001

(86) PCT No.: PCT/JP01/09671

§ 371 (c)(1),
(2), (4) Date: Apr. 16, 2003

(87) PCT Pub. No.: WO02/37504

PCT Pub. Date: May 10, 2002

(65) Prior Publication Data

(30) Foreign Application Priority Data

Nov. 6, 2000 (JP) .............................. 2000-336998

(51) Int. Cl.
*G06F 11/30* (2006.01)
*G21C 17/00* (2006.01)

(52) U.S. Cl. ....................................................... 702/184
(58) Field of Classification Search ............ 702/57–59, 702/81, 82, 84, 182–185; 365/201; 714/5, 714/30, 42, 54, 718, 764
See application file for complete search history.

(56) References Cited

U.S. PATENT DOCUMENTS 5,854,796 A * 12/1998 Sato ........................... 714/718

FOREIGN PATENT DOCUMENTS

| JP | 62109299 | 5/1987 |
| JP | 7153298 | 6/1995 |
| JP | 9318707 | 12/1997 |

* cited by examiner

*Primary Examiner*—Michael Nghiem
(74) *Attorney, Agent, or Firm*—David N. Lathrop, Esq.; Gallagher & Lsthrop (57) ABSTRACT

The invention relates to a hydraulic ratchet wrench with a double-action hydraulic cylinder piston drive with a gear pump (20) and a piston pump (21). According to the invention, a working stroke and a return stroke are controlled through a reversal of rotational direction of a pump motor (4), whereby the necessary flow volume is produced automatically via internal flow control valves, and without additional valve controls.

9 Claims, 9 Drawing Sheets

| Data Bit No. \ Address | 0 | 1 | 2 | 3 |
|---|---|---|---|---|
| 0 | 1 | 0 | 0 | 0 |
| 1 | 1 | 0 | 0 | 0 |
| 2 | 1 | 0 | 0 | 0 |
| 3 | 1 | 0 | 0 | 0 |
| 4 | 0 | 1 | 0 | 0 |
| 5 | 0 | 1 | 0 | 0 |
| 6 | 0 | 1 | 0 | 0 |
| 7 | 0 | 1 | 0 | 0 |
| 8 | 0 | 0 | 1 | 0 |
| 9 | 0 | 0 | 1 | 0 |
| 10 | 0 | 0 | 1 | 0 |
| 11 | 0 | 0 | 1 | 0 |
| 12 | 0 | 0 | 0 | 1 |
| 13 | 0 | 0 | 0 | 1 |
| 14 | 0 | 0 | 0 | 1 |
| 15 | 0 | 0 | 0 | 1 |

FIG.6 B

| Data Bit No. \ Address | 0 | 1 | 2 |
|---|---|---|---|
| 0 | 1 | 0 | 0 |
| 1 | 1 | 0 | 0 |
| 2 | 1 | 0 | 0 |
| 3 | 1 | 0 | 0 |
| 4 | 1 | 0 | 0 |
| 5 | 1 | 0 | 0 |
| 6 | 0 | 1 | 0 |
| 7 | 0 | 1 | 0 |
| 8 | 0 | 1 | 0 |
| 9 | 0 | 1 | 0 |
| 10 | 0 | 1 | 0 |
| 11 | 0 | 1 | 0 |
| 12 | 0 | 0 | 1 |
| 13 | 0 | 0 | 1 |
| 14 | 0 | 0 | 1 |
| 15 | 0 | 0 | 1 |

FIG.6 C

| Data Bit No. \ Address | 0 | 1 | 2 | 3 | 4 |
|---|---|---|---|---|---|
| 0 | 1 | 0 | 0 | 0 | 0 |
| 1 | 1 | 0 | 0 | 0 | 0 |
| 2 | 0 | 0 | 0 | 1 | 0 |
| 3 | 1 | 0 | 0 | 0 | 0 |
| 4 | 0 | 1 | 0 | 0 | 0 |
| 5 | 0 | 1 | 0 | 0 | 0 |
| 6 | 0 | 1 | 0 | 0 | 0 |
| 7 | 0 | 0 | 0 | 1 | 0 |
| 8 | 0 | 0 | 1 | 0 | 0 |
| 9 | 0 | 0 | 1 | 0 | 0 |
| 10 | 0 | 0 | 1 | 0 | 0 |
| 11 | 0 | 0 | 1 | 0 | 0 |
| 12 | 0 | 0 | 1 | 0 | 0 |
| 13 | 0 | 0 | 0 | 1 | 0 |
| 14 | 1 | 0 | 0 | 0 | 0 |
| 15 | 0 | 0 | 0 | 0 | 1 |

| | VALUE OF COUNTER 10F → | | | | | | | |
|---|---|---|---|---|---|---|---|---|
| | 0 | 1 | 2 | 3 | 4 | 5 | 6 | 7 |
| 0 | 1 | 0 | 0 | 0 | 0 | 0 | 0 | 0 |
| 1 | 0 | 1 | 0 | 0 | 0 | 0 | 0 | 0 |
| 2 | 0 | 0 | 1 | 0 | 0 | 0 | 0 | 0 |
| 3 | 0 | 0 | 0 | 1 | 0 | 0 | 0 | 0 |
| 4 | 0 | 0 | 0 | 0 | 1 | 0 | 0 | 0 |
| 5 | 0 | 0 | 0 | 0 | 0 | 1 | 0 | 0 |
| 6 | 0 | 0 | 0 | 0 | 0 | 0 | 1 | 0 |
| 7 | 0 | 0 | 0 | 0 | 0 | 0 | 0 | 1 |
| 8 | 0 | 0 | 0 | 0 | 0 | 0 | 0 | 0 |
| 9 | 0 | 0 | 0 | 0 | 0 | 0 | 0 | 0 |
| 10 | 0 | 0 | 0 | 0 | 0 | 0 | 0 | 0 |
| 11 | 0 | 0 | 0 | 0 | 0 | 0 | 0 | 0 |
| 12 | 0 | 0 | 0 | 0 | 0 | 0 | 0 | 0 |
| 13 | 0 | 0 | 0 | 0 | 0 | 0 | 0 | 0 |
| 14 | 0 | 0 | 0 | 0 | 0 | 0 | 0 | 0 |
| 15 | 0 | 0 | 0 | 0 | 0 | 0 | 0 | 0 |

DATA BIT No. ↓

MEMORY DEFECT REMEDY ANALYZING METHOD AND MEMORY TEST INSTRUMENT

TECHNICAL FIELD

The present invention relates to a memory failure recovery analysis method for application to a memory testing apparatus equipped with a failure recovery function which tests a semiconductor memory provided with a failure recovery cell array, then decides whether a failing cell is recoverable, and if so, recovers it, and the invention also pertains to a semiconductor memory testing apparatus using the failure recovery analysis method.

BACKGROUND ART

Semiconductor memory testers are roughly divided into a memory testing apparatus of the type testing semiconductor memories in wafer form prior to packaging and a memory testing apparatus of the type testing semiconductor memories in packaged form. The memory testing apparatus of the type that tests semiconductor memories (hereinafter referred to simply as memories) prior to packaging greatly differs from the memory testing apparatus of the type testing packaged memories in the possession of the function that decides whether a failing cell is recoverable and, if so, recovers the failing cell.

Figure 1:
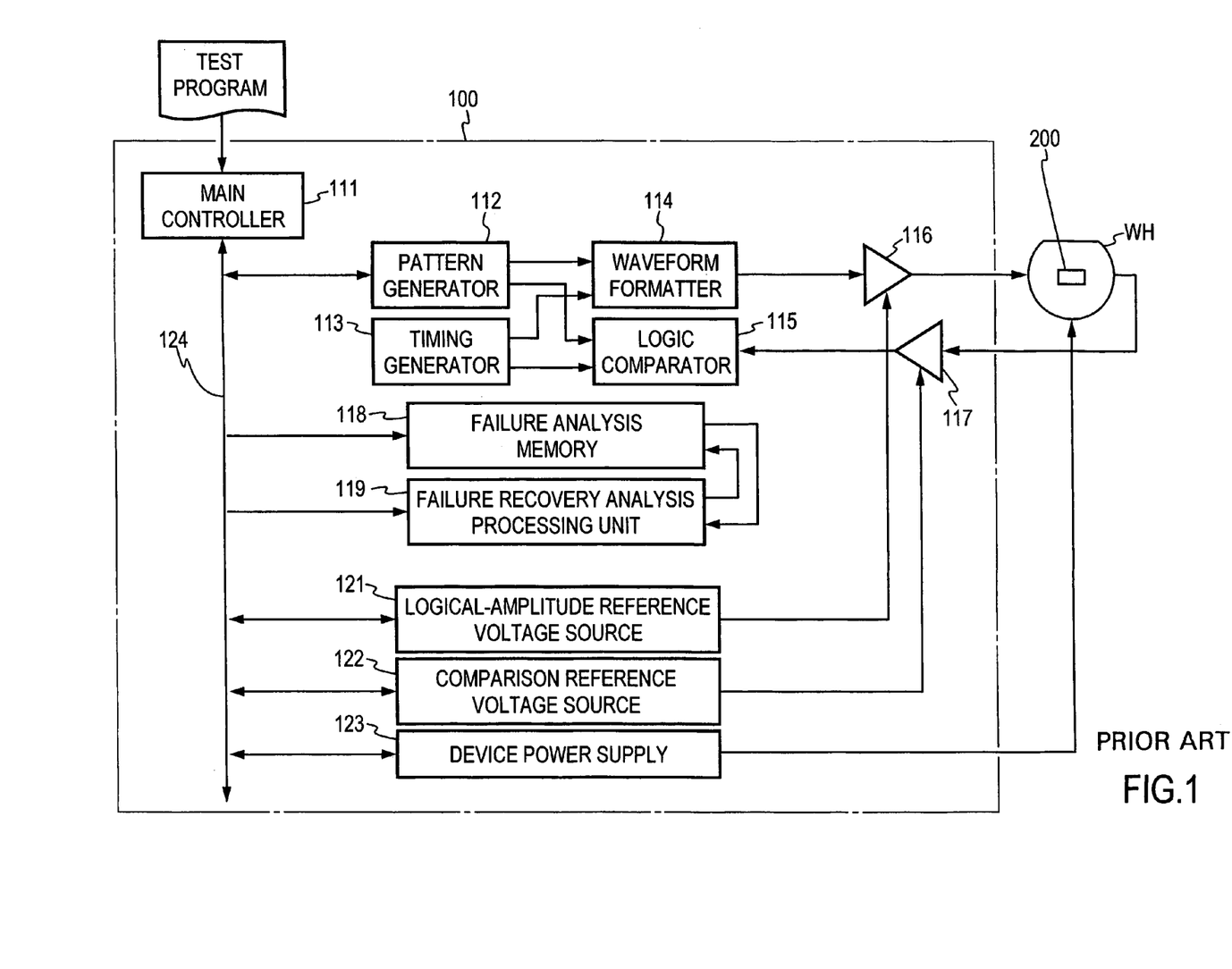
FIG. 1 is a block diagram for explaining the general outline of the memory testing apparatus.

In FIG. 1 there is depicted the general outline of the functional configuration of a memory testing apparatus equipped with the failure recovery function. The memory testing apparatus, denoted generally by 100, comprises: a main controller 111, a pattern generator 112; a timing generator 113; a waveform formatter 114; a logic comparator 115; a group of drivers 116; a group of analog comparators 117; a failure analysis memory 118; a failure recovery analysis processing unit 119; a logical-amplitude reference voltage source 121; a comparison reference voltage source 122; and a device power supply 123. The main controller 111, the pattern generator 112, the timing generator 113, the waveform formatter 114, the logic comparator 115 and the failure analysis memory 118 are connected to a tester bus 124.

The main controller 111 is usually constituted by a computer, which executes a user's prepared test program to control mainly the pattern generator 112 and the timing generator 113, by which test pattern data, that is, address data, a control signal and expected value data, is generated by the pattern generator 112, then the test pattern data except the expected value data is converted by the waveform formatter 114 to a test pattern signal having a real waveform, and the test pattern signal is voltage amplified by the driver 116 to a signal of a waveform having an amplitude set in the logical-amplitude reference voltage source 121, thereafter being applied to a memory under test 200 formed on a semiconductor wafer WH to store therein the test data, A response signal read out of the memory under test 200 is applied to the analog comparator 117 which compares it with a reference voltage provided from the comparison reference voltage source 122 to decide whether it has a predetermined logical level (H-logic voltage, L-logic level), and the signal decided to have the predetermined logical level is compared by the logic comparator 115 with the expected value data fed from the pattern generator 112; when a mismatch with the expected value data is found, it is decided that a memory cell of the address from which the response signal was read out is failing, then fail data from the logic comparator 115 is stored in the address position of the failure analysis memory 118 corresponding to that readout address, and at the conclusion of the test it is decided by the failure recovery analysis processing unit 119 whether the failing cell is recoverable or not. In FIG. 1 there is shown the case where the write data and the read data of the memory 200 are both one-bit, but when these pieces of data are composed of plural bits, the numbers of drivers 116 and analog comparators 117 used are the same as the number of bits.

Figure 2:
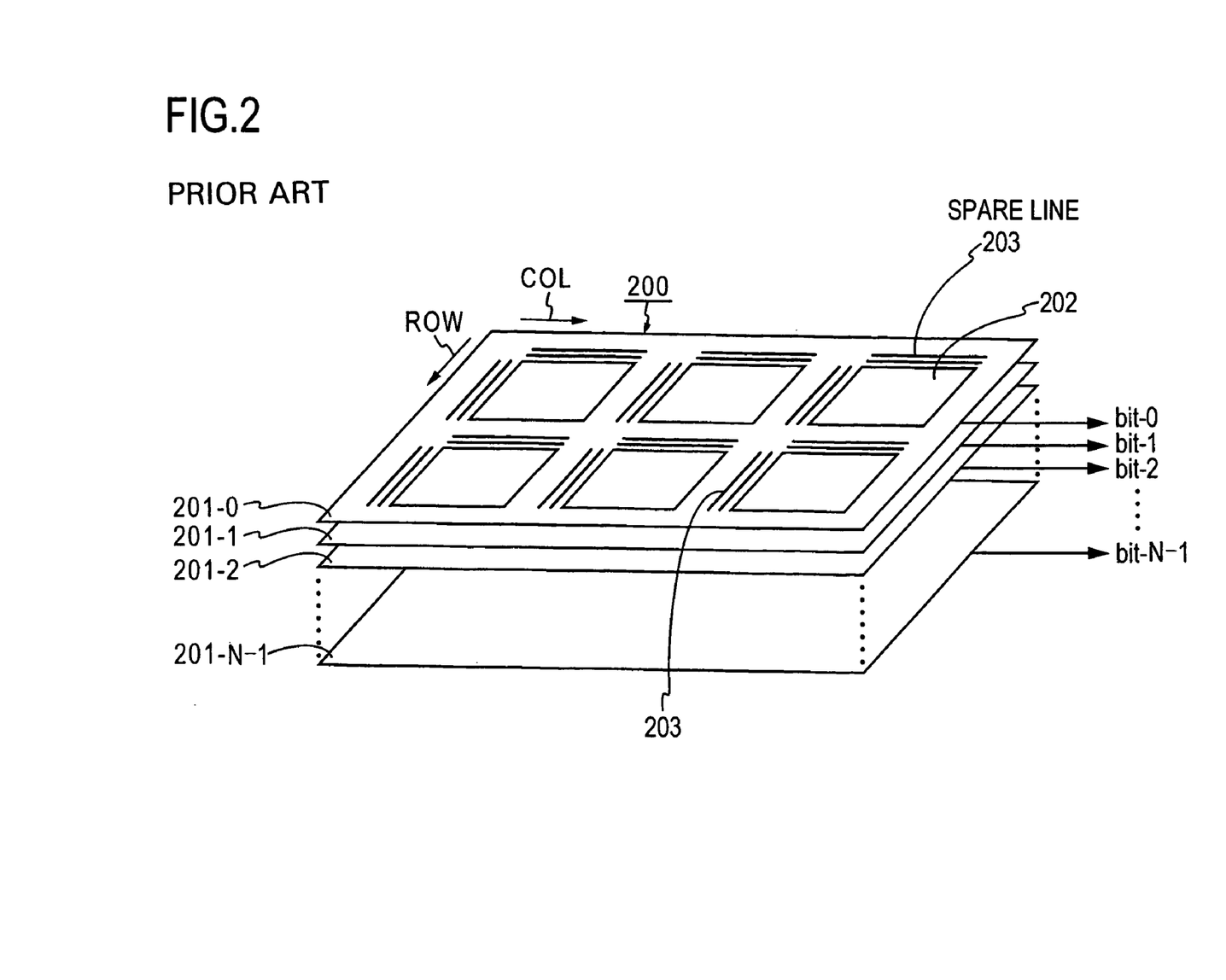
FIG. 2 is a diagram conceptually showing the internal configuration of a plural-bit-data memory under test which is provided with spare lines.

With reference to FIG. 2 conceptually showing the redundant memory 200, a brief description will be given below of its internal configuration in which the number N of data bits is plural and spare lines are provided accordingly.

In memory cell array groups which are so-called memory planes 201-0, 201-1, 201-2, - - -, 201-N-1 are respectively stored zeroth bit data bit-0, first bit data bit-1, . . . , N-th bit data bit-N of N-bit data. In the respective memory cell array groups (memory planes) 201-0, 201-1, 201-2, - - - there are formed a plurality of memory arrays 202, and a spare cell line 203 is formed adjacent the position where the respective memory cell arrays each are formed. The spare cell line is commonly called a spare line, which is formed by an arrangement of memory cells of the same number as that of the memory cells on each address line in the memory cell array 202; for example, two or more memory cells are formed in each of a column address direction COL and a row address direction ROW.

Figure 3:
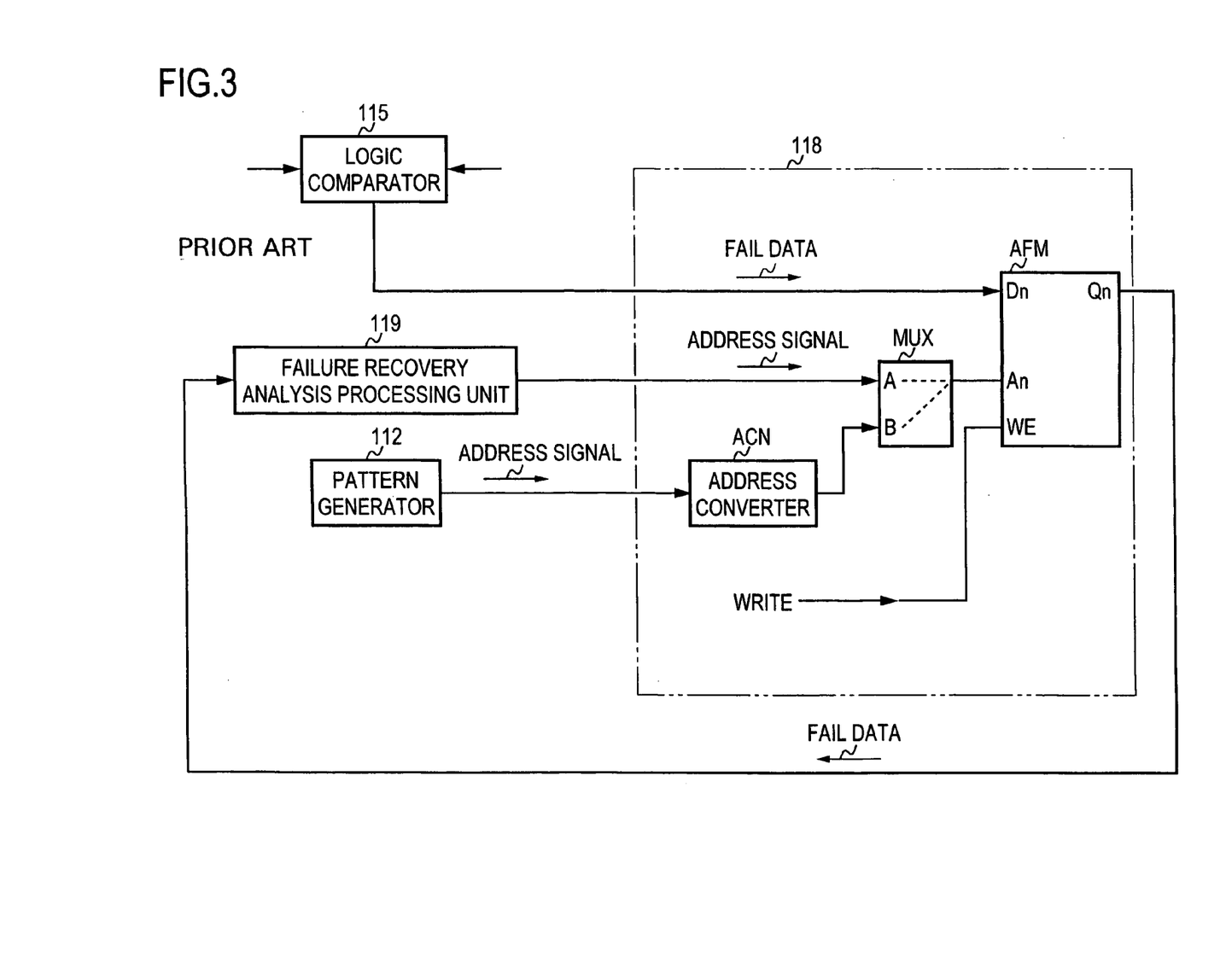
FIG. 3 is a block diagram for explaining the functional configuration of a conventional failure analysis memory.

The failure analysis memory 118 comprises, as depicted in FIG. 3: a storage part AFM; a multiplexer MUX which selectively applies an address signal to an address terminal An of the storage part AFM; and an address converter ACN which converts an address signal in the test pattern data fed from the pattern generator 112 (see FIG. 1) to an address signal of the corresponding address signal of the failure analysis memory 118; upon each detection of a mismatch in the logic comparator 115, a write signal WRITE is applied to a write control terminal WE of the storage part AFM in synchronization with the corresponding fail detection signal. Fail data, which is the output from the logic comparator 115, is provided to a data terminal Dn of the storage part AFM.

The addresses of the memory under test 200 have a one-to-one correspondence to the addresses of the storage AFM; if exactly identical, the address signal applied to the address converter ACN passes therethrough intact.

Figure 4:
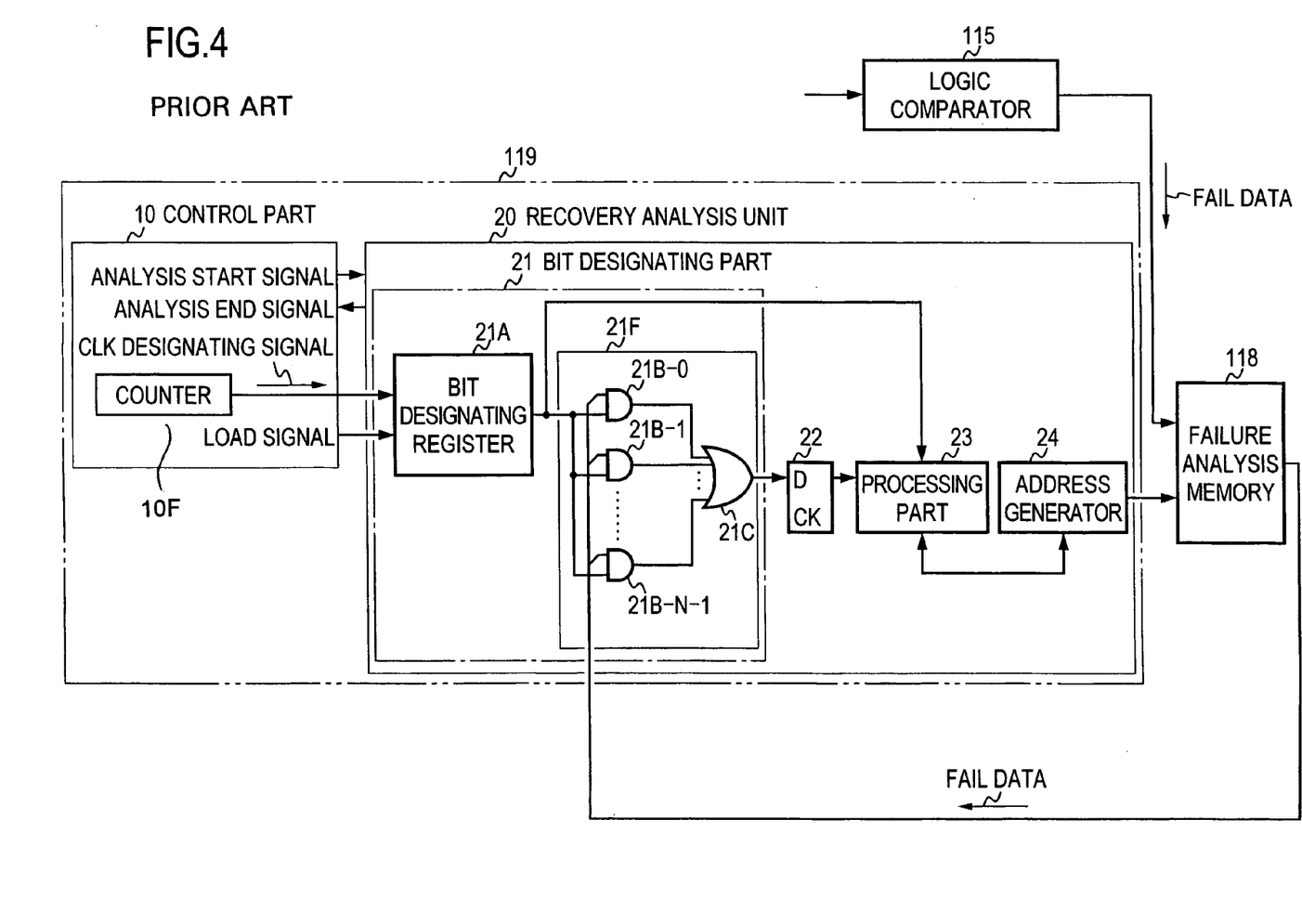
FIG. 4 is a block diagram for explaining the functional configuration of a conventional failure recovery analysis processing unit.

The failure recovery analysis processing unit 119 comprises, as shown in FIG. 4, a control part 10 and a recovery analysis unit 20 which is controlled by the control part 10 to operate. The recovery analysis unit 20 comprises a bit designating part 21, a latch circuit 22, processing part 23, and an address generator 24.

During testing the memory 200, in the failure analysis memory 118 the multiplexer MUX selects the address signal fed to its input terminal B from the address converter ACN and provides it to the address input terminal An of the storage part AFM, and upon each occurrence of a mismatch in the logic comparator 115, fail data from the logic comparator 115 is stored in that address of the storage part AFM corresponding to the address of the memory under test 200 for which the mismatch is detected. Incidentally, each cell of the storage part AFM is pre-initialized to the "0" logic.

The fail data mentioned herein is data which has a bit of the "1" logic for which a mismatch was found in the result of comparison between the data read out of the memory under test 200 and the expected value data and a bit of the "0" logic for which no such a mismatch was detected.

During the failure recovery analysis the multiplexer MUX selects address signals applied to its input terminal An from the address generator 24 (FIG. 4) in the failure recovery analysis processing unit 119 and provides the selected address signals to the address terminal An of the storage part AFM, and the pieces of fail data are read out of the storage part AFM one after another.

The N-bit fail data thus read out of the storage part AFM is provided to the bit designating part 21 (FIG. 4) in the failure recovery analysis processing unit 119. In the bit designating part 21, data of the bit in the fail data designated by the output from a bit designating register 21A is fed via an OR circuit 21C to the latch circuit 22. That is, logarithmic value data of a counter 10F in the control part 10 is provided to the bit designating register 21A, then the bit designating register 21A decodes the count value data, and the output from the bit designating register 21A enables any one of gates 21B-0, . . . , 21B-N-1 provided corresponding to respective bits in the N-bit fail data, through which the corresponding bit in the fail data is provided to the latch circuit 22.

The one-bit data thus provided to the latch circuit 22 is recognized by the address signal from the address generator 24 as to form which address was read out the fail data to which the one-bit data belongs, and furthermore, which bit in the fail data read out of that address is failing, that is, the position on the cell line (called an address line) designated by an address on the memory cell array, is specified by the content (bit designating data) of the bit designating register 21A. The processing part 23: reads thereinto, upon each latching of a "1" into the latch circuit 22, the corresponding address and bit designating data; specifies the address and bit position of the fail data; counts the number of failing cells at the specified bit position (memory plane) for each address line; upon conclusion of the readout from all addresses, analyzes whether the address line is recoverable with the spare line 203 formed adjacent each memory cell array; and, if recoverable, the address line concerned is electrically replaced with the corresponding spare line. Next, the counter 10F is incremented by one, then fail data of all addresses in the storage part AFM is read out therefrom, then for the next bit number (on the next memory plane) of the fail data, the number of failing cells for each address line is counted, and the address line, if recoverable, is replaced with the corresponding spare line 203. Thereafter, the same recovery analysis processing as mentioned above is performed for each bit number of the fail data. In this way, a defective memory can be changed to a non-defective memory.

As described above, in the prior art the fail data of the bit designated by the bit designating part 21 is sent to the processing part 23 bit by bit in address order. That is, the recovery analysis processing, in which the memory cell array groups 201-0, 201-1, 201-2, . . . shown in FIG. 2 are designated by the bit designating register 21A on a group-wise basis and all the addresses of each memory cell array group are read out, is carried out for each of the memory array cell groups 201-0, 201-1, 201-2, . . . Accordingly, the prior art method is defective in that much time is required for the recovery analysis.

An object of the present invention is to provide a memory recovery analysis method that enables a recovery analysis to be made in a shorter time than in the prior art, and a memory testing apparatus using the recovery method.

SUMMARY OF THE INVENTION

According to the method of the present invention, plural bits of fail data are ORed which are read out of a failure memory, in which the fail data is stored for each bit, and based on the result of ORing, the plural bits are simultaneously subjected to the recovery analysis.

The apparatus of the present invention is provided with: a failure analysis memory for storing fail data which is the result of bit-wise logic comparison of data read out of a memory under test and expected value data; an analysis data bit designating part for outputting bit designating data for designating plural bits in the fail data read out of the failure analysis memory; a logic circuit supplied with the bit designating data from the analysis data bit designating part and the fail data, for outputting the OR of the designated bits in the fail data; and a processing part supplied with the output from the logic circuit and the address from which the fail data was read out, for performing a remedy analysis.

According to the recovery analysis method of the present invention, by ORing plural bits of the fail data read out of the failure analysis memory, the data of the plural bits is compressed into single bit form and is subjected to the remedy analysis—this permits simultaneous recovery of plural data bits and hence reduces the time for recovery analysis. When the data compressed into single bit form indicates a failure, the bit corresponding to the failing cell can easily be located by reading out the corresponding plural bits from the failure analysis memory.

BEST MODE FOR CARRYING OUT THE INVENTION

Figure 5:
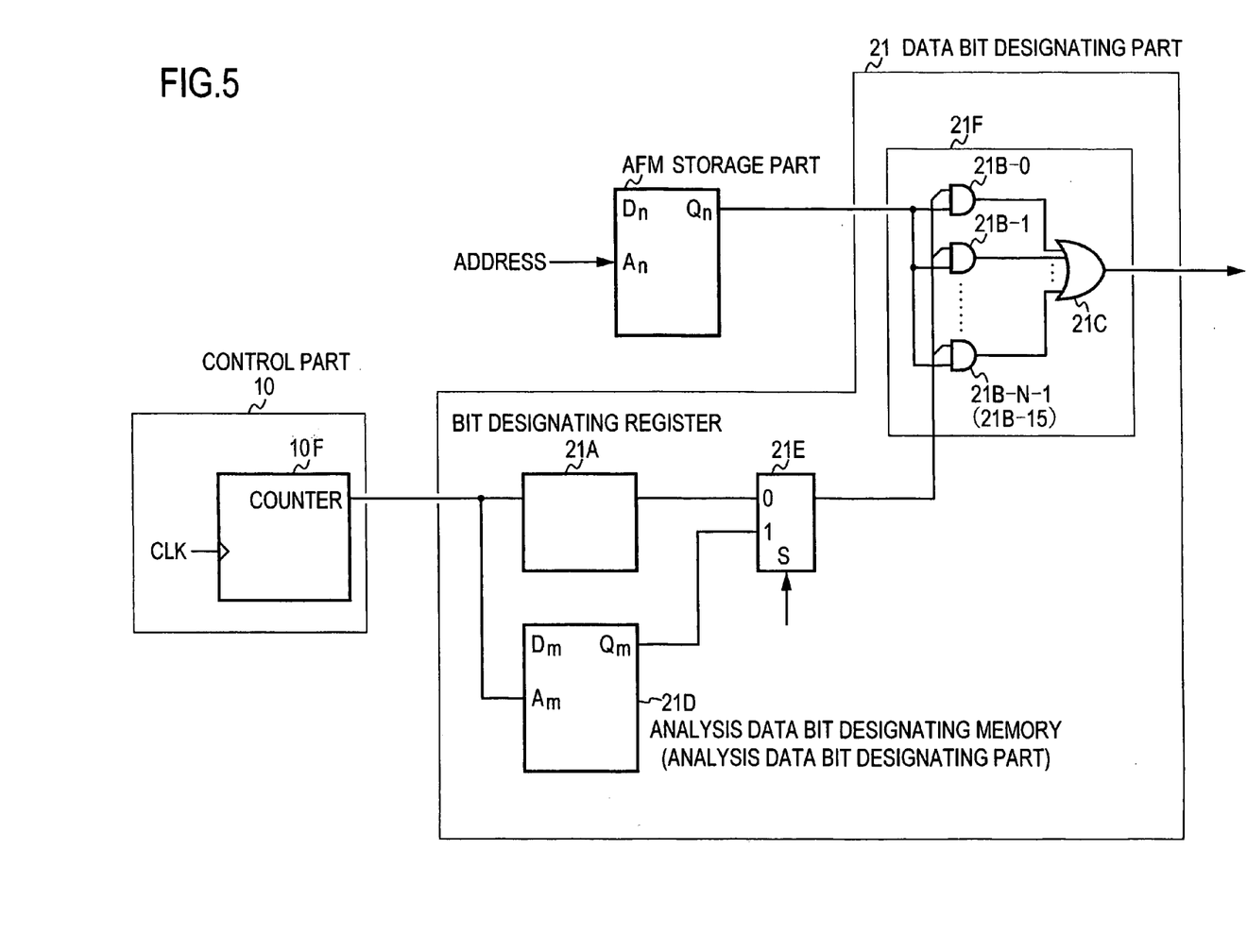
FIG. 5 is a block diagram showing the principal part of an embodiment of a memory testing apparatus embodying the failure recovery analysis method according to the present invention.

FIG. 5 illustrates an embodiment of the principal part of a memory testing apparatus embodying the recovery analysis method according to the present invention. The part depicted in FIG. 5 is the bit designating part 21 and has, as in FIG. 4, a bit designating register 21A, and a logic circuit 21F comprising gates 21B-0, . . . , 21B-N-1 each of which extracts a designated bit from fail data by bit designating data from the bit designating register 21A, and an OR gate 21C for ORing the outputs from these gates.

In this embodiment the bit designating part 21 is further provided with an analysis data bit designating part 21D and a selector 21E for selectively outputting bit designating data from the analysis data bit designating part 21D and bit designating data from the bit designating register 21A. The analysis data bit designating part 21D is capable of generating bit designating data for designating plural bits in fail data, and in this embodiment it is an analysis data bit designating memory.

Count value data of the counter 10F of the controller 10 is also provided as an address signal to the address terminal Am of the analysis data bit designating memory 21D.

Figure 6:
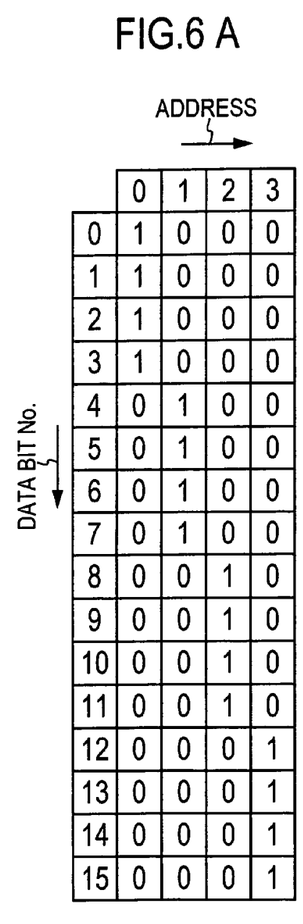
FIGS. 6A, 6B and 6C are diagrams respectively showing examples of stored contents of an analysis data bit designating memory 21D in FIG. 5.

In the analysis data bit designating memory 21D there is stored at least one of pieces of bit designating data which enable plural ones of the gates 21B-0, . . . , 21B-N-1. This storage is set by a user's arbitrary write into the memory. FIG. 6A shows an example. This example shows the case where the number of bits of the fail data is 16 and bit designating data is stored in addresses 0 to 3 for performing a remedy analysis of the fail data by steps of fours bits at one time. That is, in the analysis data bit designating memory 21D having all cells initialized to the "0" logic, the "1" logic is written in each of the cells of the address 0 which correspond to bits NO. 0, 1, 2 and 3 of the fail data; the "1" logic is written in the cells of the address 1 which correspond to bits NO. 4, 5, 6 and 7 of the fail data; and thereafter, the "1" logic is similarly written in each of the cells of the addresses 2 and 3 which correspond to bits NO. 8, 9, 10, 11 and NO. 12, 13, 14, 15 of the fail data, respectively.

Figure 7:
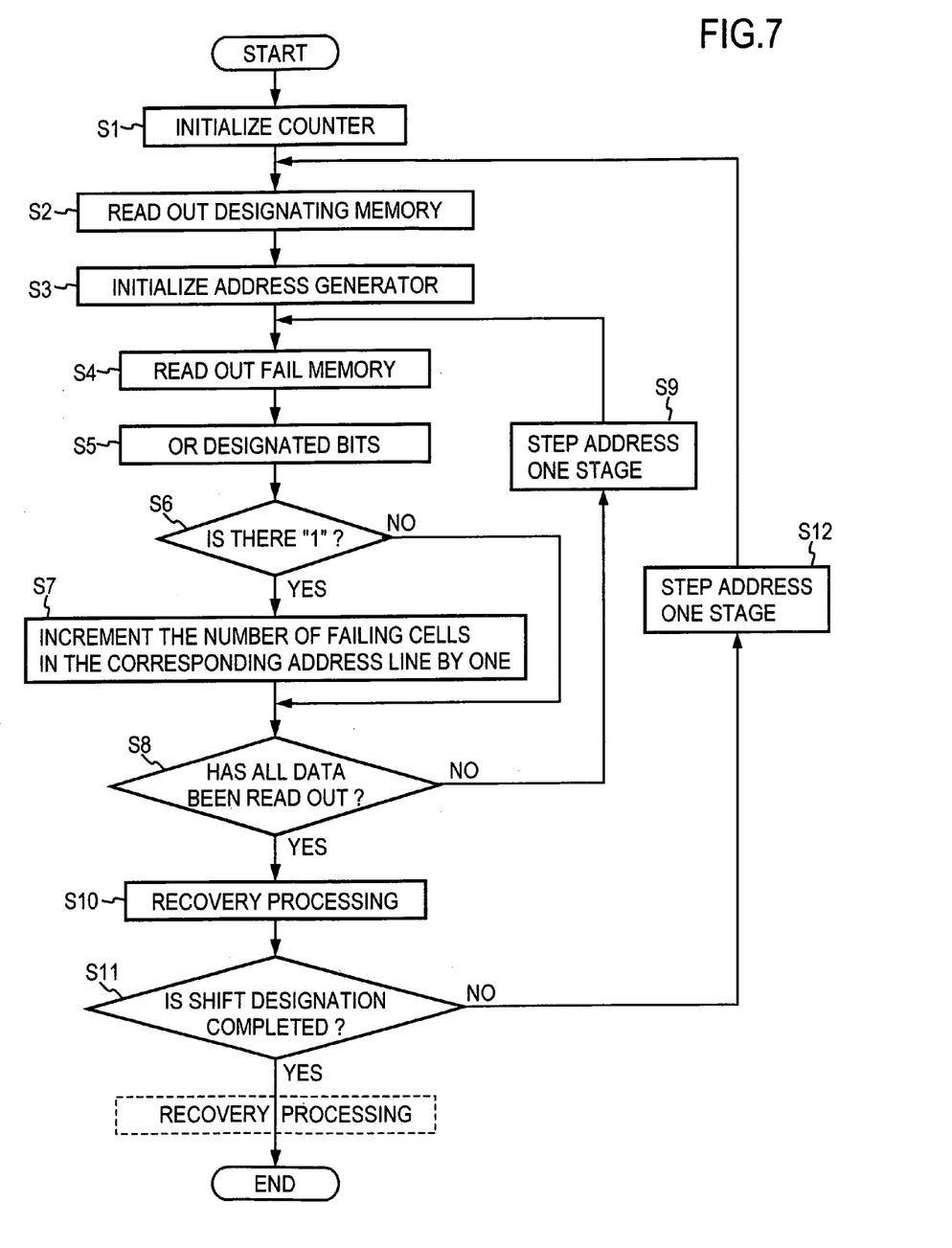
FIG. 7 is a flowchart showing the procedure of an embodiment of this invention method.

Referring to FIG. 7, a description will be given of an example of the procedure for performing a failure analysis by use of such an analysis data bit designating memory 21D. The selector 21E is assumed to be controlled by the main controller 111 (FIG. 1) to select the bit designating data read out of the analysis data bit designating memory 21D.

In step S1 the counter 10F is initialized, and in step S2 the analysis data bit designating memory 21D is read out using count value data of the counter 10F as an address. Accordingly, bit designating data 111100 . . . 0 in the address 0 of the memory 21D, shown in FIG. 6A, is read out, and the respective pieces of bit data are provided to the gates 21B-0, . . . , 21B-15 of the logic circuit 21F, enabling the gates 21B-0, 21-B-1, 21B-2 and 21B-3.

In step S3 the address generator 24 (FIG. 4) of the failure analysis memory is initialized. In step S4 the storage part AFM is read out addressing by an address signal from the address generator 24. Incidentally, the multiplexer MUX in FIG. 3 is pre-controlled by the main controller 111 (FIG. 1) to select an address signal from the failure remedy analysis processing unit 119.

In step S5 designated bits in the fail data read out of the storage part AFM are ORed. That is, in FIG. 5 respective pieces of data of 0-th to 15th bits of the read-out fail data are provided to the gates 21B-0 to 21B-15; in this example, since only the gates 21B-0 to 21B-3 are held enabled, only those 0-th to 3rd bits in the fail data designated by the bit designating data are fed to the OR gate 21C, wherein they are ORed.

In step S6 a check is made o see if the OR calculated in step S5 is the "1" logic or not, and if it is the "1" logic, then in step S7 the number of failing cells for the address line corresponding to the address signal from the address generator 24 (FIG. 4) is incremented by a 1. That is, if any one of the NO. 0 to NO. 3 bits of the read-out fail data is the "1" logic, the failing cell count value of the address line concerned is incremented by a 1. This processing is performed by the processing unit 23 (FIG. 4). In the case of designating a cell by the ROW address and the COL address as depicted in FIG. 2, the number of failing cells is incremented by a 1 for these address lines.

In step S8 a check is made to see if all the pieces of fail data in the storage part AFM have been read out, and if not, then in step S9 the address signal which is generated by the address generator 24 is stepped one stage, followed by a return to step S4. If it is decided in step S6 that the OR is not the "1" logic, then the procedure goes to step S8.

Upon completion of reading out all the pieces of fail data in this way, a remedy analysis is performed in step S10. The number of failing cells in each address line is analyzed, and a remediable address line is switched to the corresponding spare line for all the bits NO. 0 to NO. 3 at the same time. Accordingly, for example, even if only the bit NO. 1 is failing in a certain address line, the bits NO. 0, NO. 2 and NO. 3 are also switched to the spare line. This recovery analysis needs only to be made by the processing part 23 (FIG. 4) in the same manner as in the prior art. The scheme used differs from the conventional one only in that an address line is switched to a spare line for all of the designated plural bits at the same time.

Next, in step S11 a check is made to see if desired bits in the fail data have all been designated, and if not, then the counter 10F is stepped one stage in step S12, followed by a return to step S2. Accordingly, in this example bit designating data 000111100 . . . 0 stored in its address 2 is read out from the analysis data bit designating memory 21D, and this data is provided to the gates 21B-0 to 21B-15, by which only the gates 21B-4 to 21B-7 are enabled. In this state, all the pieces of fail data are read out in the same manner as described above, then the pieces of data of the designated bits NO. 4 to NO. 7 are ORed, and based on the results of ORing, address lines for the bits NO. 4 to NO. 7 are simultaneously subjected to the recovery analysis processing.

Thereafter, similar processing is carried out, and when desired bits in the fail data are all designated, that is, in this example, when the recovery analysis is completed by reading out the bit designating data from the address 3 of the analysis data bit designating memory 21D, the entire processing is concluded.

Conventionally, since the recovery analysis processing is performed for each bit of the fail data, the readout of all pieces of fail data from the storage part AFM needs to be repeated by the number N of bits of fail data, that is, 16 times in the FIG. 6A example, but this embodiment requires only four repetitions; furthermore, the prior art requires 16 repetitions of the analysis processing for address-to-spare line switching based on the failing cell count value for each address line, but this embodiment requires only four repetitions, and hence permits reduction of the time for failure analysis.

The recovery processing of step S10 in FIG. 7 may also be performed after completion of all bit designations as indicated by the broken lines in FIG. 7. The bit designation of the fail data is not limited specifically to groups of four bits; the number of bits may differ for each designation. Provision may be made to designate, for instance, six bits NO. 0 to NO. 5, six bits NO. 6 to NO. 11, and four bits NO. 12 to NO. 15 as shown in FIG. 6B. Moreover, the bit designation need not always be limited to consecutive bit numbers but only one bit may be designated. That is, for example, plural bit numbers which are empirically known to be almost free from the occurrence of failing cells are designated together as many as possible, and only one bit for which it is known that failing cells occur relatively easily is designated. For example, it is possible to sequentially generate such bit designating data as shown in FIG. 6C. In some cases, no bits need to be designated for one or more particular bit numbers; that is, it is also possible that some pieces of bit designating data do not designate any bits in the fail data. Additionally, all the bits of the fail data may be designated at one time.

It is also possible to utilize a configuration which does not involve reading out the bit designating data from the memory 21D and in which: for example, the "1" logic is preset in each of plural stages of a shift register having stages of the same number as the bit widths of the fail data; the output from respective stages of the shift register are used to form the bit designating data; and, upon each reading out all addresses of the storage part AFM, the shift register is shifted stages corresponding to the "1" logic. Alternatively, the bit designating data may be produced by calculation upon each completion of readout of all fail data, that is, in step S2 in FIG. 7. To this end, the analysis data bit designating memory 21D in FIG. 5 is used as an analysis data bit designating part for generating bit designating data, and when it becomes necessary to generate the bit designating data, the control part 10 instructs the analysis data bit designating part to conduct the calculation; if necessary, parameters necessary for the calculation are provided to the analysis data bit designating part. As will be seen from the above, the bit designating data may also be generated by software.

In the embodiment of FIG. 5, the same failure analysis processing as in the prior art could be performed by selecting the bit designating data from the bit designating register 21A by the selector 21E and applying it to the logic circuit 21F. Further, by setting desired data in the counter 10F or bit designating register 21A with the selector 21E held in the state in which to select the bit designating data from the bit designating register 21A, a check can be made to determine which one of plural pieces of, for example, compressed bit data is a true failing cell. For example, in the case of using the bit designating data depicted in FIG. 6A, the 4-bit data produced by the bits NO. 4 to NO. 7 of the fail data is compressed into 1-bit data and the recovery analysis processing is performed; even if it is decided that recovery is impossible, there is the possibility of obtaining a recovery solution by carrying out the recovery analysis processing for each bit number of the bits NO. 4 to NO. 7 of the fail data. That is, for example, when "1" logic data indicating a failure is present in different addresses of the bits NO. 4 to NO. 7 of the fail data, if the recovery analysis processing is performed after compression of the bits NO. 4 to NO. 7 of the fail data, recovery is needed for four address lines. If, however, respective bit numbers of the bits NO. 4 to NO. 7 of the fail data are designated and the recovery analysis processing is carried out for each bit number, one piece of the "1" logic data indicating a failure is provided for each bit number; hence, it is necessary only to perform recovery for each address line.

Figure 8:
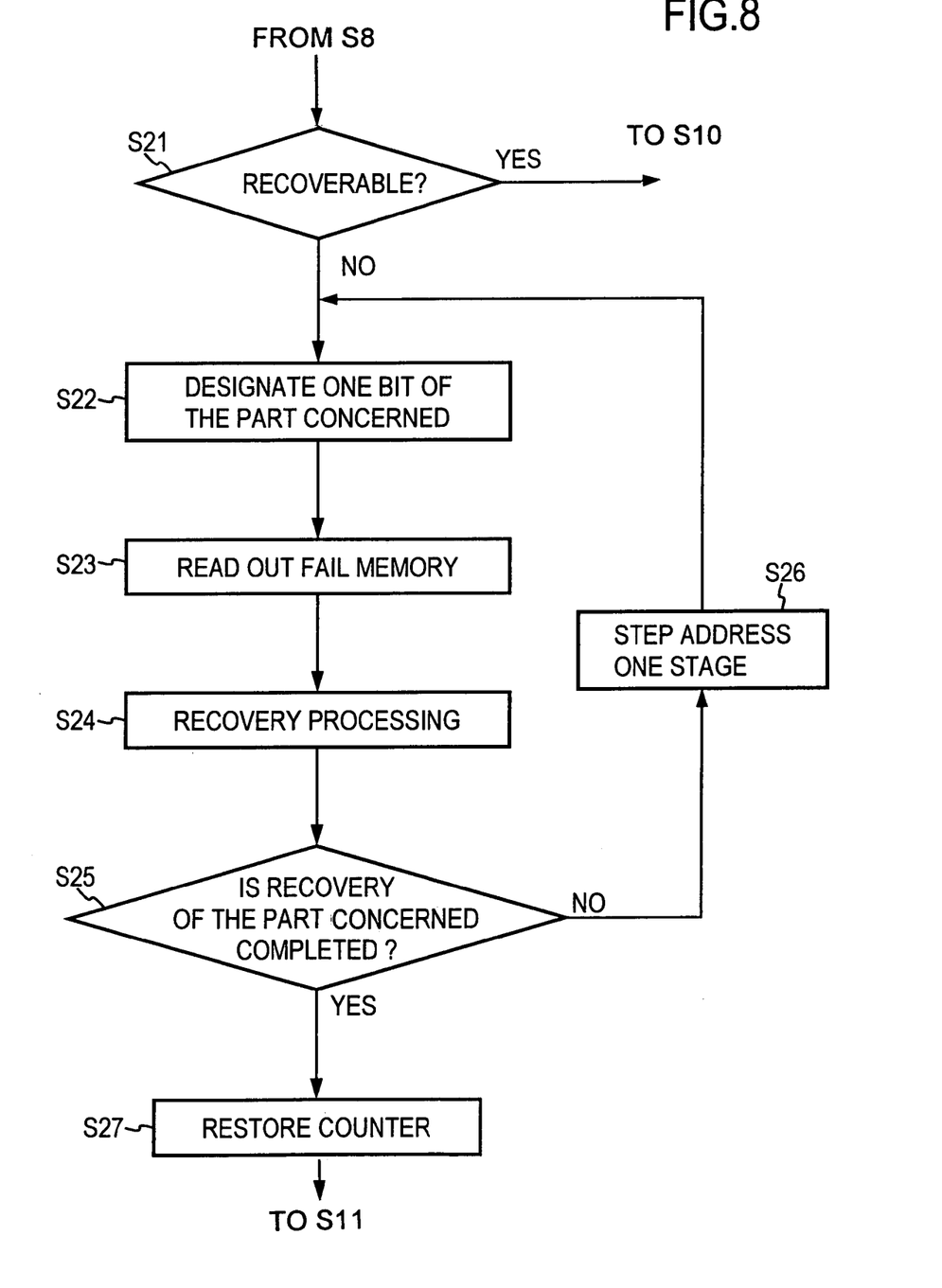
FIG. 8 is a flowchart sowing an example of the procedure for one-bit-designating recovery analysis which is performed when impossible by a plural-bit-designating failure recovery analysis.
Figure 9:
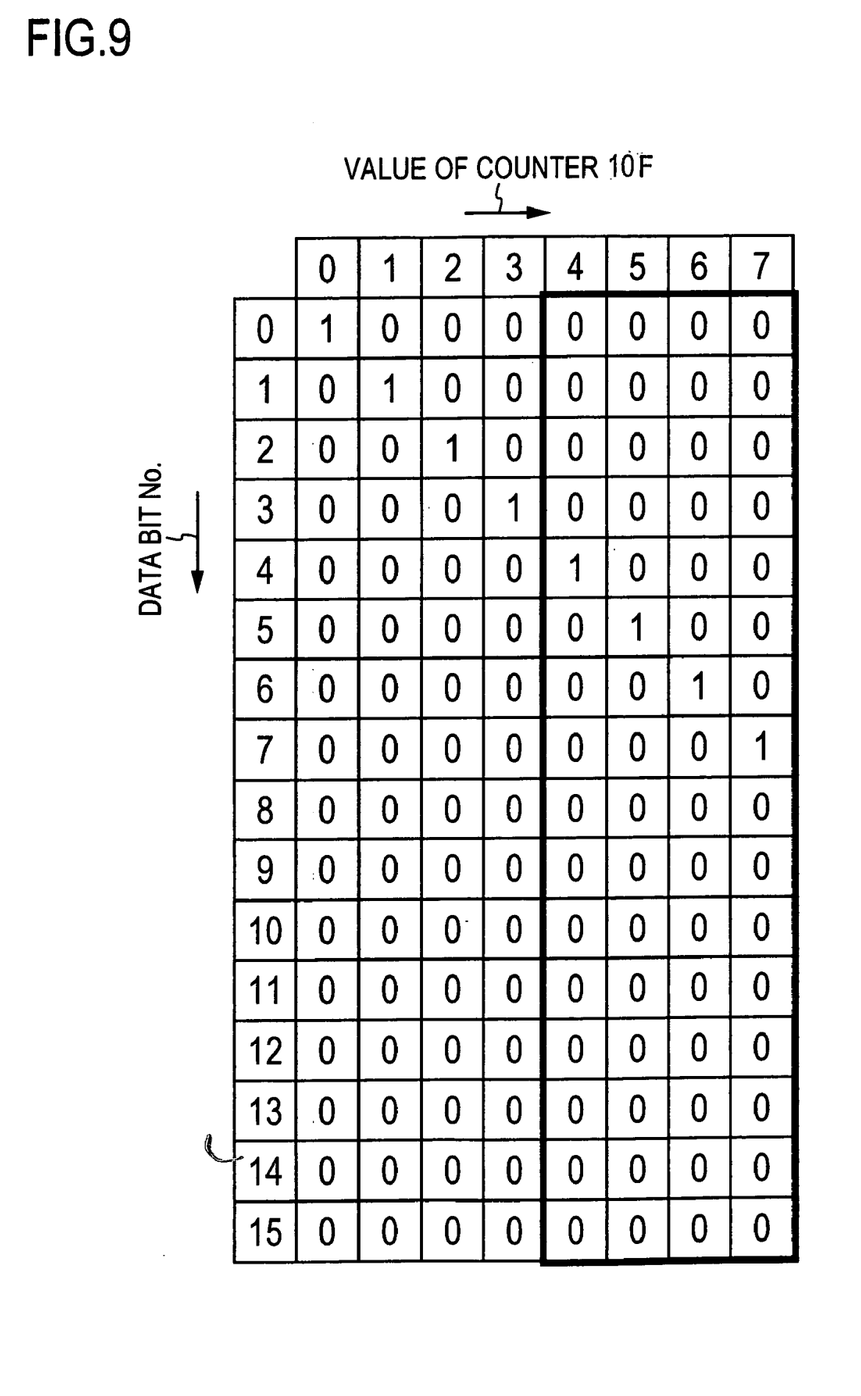
FIG. 9 is a diagram depicting an example of bit designating data which is output from a bit designating register 21A in the procedure shown in FIG. 8.

Such a procedure is carried out, for example, as follows: Upon completion of the readout of all data in step S8 in FIG. 7, a check is made in step S21 in FIG. 8 to see if the failing cell recovery is possible; if impossible, the output from the bit designating register 21A is selected by the selector 21E (FIG. 5) in step S22; the bit designating bit, which designates one bit of the portion concerned, that is, one of the bits NO. 4 to NO. 7 of the fail data, the bit NO. 4 in this example, is provided from the bit designating register 21A to the logic circuit 21F since the count value 4 of the counter 10F is provided to the bit designating register 21A; in step S23 all addresses of the fail data storage part are read out; in step S24 the recovery analysis processing is carried out for the output from the logic circuit 21F provided for the read-out data; in step S25 it is decided whether the recovery analysis processing for the designated one bit of the portion concerned has been completed; and, if not, the counter 10F is stepped one stage in step S26 and the procedure goes to step S22, in which failure analysis processing is performed designating the next bit NO. 5 alone. In this way, the pieces of bit designating data, each designating one of the bits NO. 4 to NO. 7 as shown in the thick-lined frame, are sequentially output from the bit designating register 21A, and the failure recovery analysis processing is carried out on a bit-wise basis.

Upon completion of the failure recovery analysis processing for the designated one bit of the portion concerned, that is, upon completion of the failure recovery analysis processing for the bit NO. 7 in this example, the content of the counter 10F, which is the numerical data prior to the 1-bit designated failure recovery analysis processing, is preset to data of numerical value 4 in this example, then the selector 21E is switched to the selection of the output from the bit designating memory 21D, after which the procedure goes to step S11 in FIG. 7. Incidentally, when the 1-bit designated failure recovery analysis processing is begun in step S22, the count value 4 of the counter 10F at that time is stored in a register in the control part 10, and the stored value is used to restore the counter 10F in step S27. When it is decided in step S21 that recovery is possible, the recovery processing is performed, after which the procedure goes to step S11 in FIG. 7.

In FIG. 5 it is also possible to omit the bit designating register 21A and the selector 21E and to provide the bit designating data from the analysis data bit designating part 21D directly to the logic circuit 21F. The bit width of the fail data, that is, the bit width of the data that is stored in the memory under test 200 is not limited specifically to 16 bits.

As described above, according to the present invention, all data bits of the fail data, which are output from the logic comparator 115 during test, are stored intact in the failure analysis memory 118, and at the time of the recovery analysis processing arbitrary plural bits in the fail data are compressed for recovery analysis processing, so that the time for recovery analysis processing can be reduced accordingly. Furthermore, when recovery is impossible with compressed fail data, the fail data is read out of the failure analysis memory 118 for each original bit NO. of the compressed fail data, and the analysis processing is performed bit by bit.

What is claimed is:

1. A memory failure recovery analysis method that comprises:
   rending out plural bits of fail data from a failure analysis memory having stored therein the fail data for each bit of an addressible location in a memory under test;
   ORing two or more but less than all of the plural bits of the fail data read out of the failure analysis memory;
   performing recovery analysis processing based on the ORed result; and
   providing memory failure recovery analysis for all of the plural bits of said fail data by one or more repetitions of ORing and performing the recovery analysis processing for other bits in the plural bits not processed;
   wherein the recovery analysis processing is performed bit by bit when the recovery analysis processing based on the result of ORing of the plural bits is decided impossible.

2. The memory failure recovery analysis method as recited in claim 1, wherein the two or more but less than all of the plural bits are selected according to failure statistics of the memory under test.

3. A memory testing apparatus comprising:
- a failure analysis memory that stores plural bits of fail data resulting from a bit-wise logical comparison between data read out of a memory under test and expected value data;
- an analysis data bit designating part that outputs bit designating data, which designates two or more but less than all of the plural bits in the fail data read out of the failure analysis memory;
- a bit designating register that outputs bit designating data for designating one bit in the fail data;
- a selector for selecting one of the output bit designating data from the bit designating register and the output designating data from the analysis data bit designating part;
- a logic circuit supplied with the bit designating data selected by the selector and said fail data that outputs the OR of designated plural bits in the fail data; and
- processing part supplied with the output from said logic circuit and an address by which said fail data was read out that performs recovery analysis processing for the memory under test.

4. The memory testing apparatus as recited in claim 3, wherein said analysis data bit designating part is formed by a memory which has the same bit width as said fail data, designates different bit numbers in the fail data, and stores plural pieces of bit designating data at least one of which designates plural bit numbers, and from which that one piece of bit designating data is read out and provided to said logic circuit.

5. The memory testing apparatus as recited in claim 4, wherein said plural pieces of bit designating data are produced so that all bits of the fail data are designated by these pieces of bit designating data.

6. The memory testing apparatus as recited in any one of claims 3 to 5, wherein:
- said analysis data bit designating part is said memory;
- said bit designating register is a decoder for outputting bit designating data for designating one bit in response to the input data; and
- a counter is provided which supplies count data as an address to said analysis data bit designating part and to said bit designating register.

7. A memory failure recovery analysis method which reads out fail data from a failure analysis memory having stored therein the fail data for each bit and performs failure recovery analysis processing, the method comprising:
- ORing plural bits of the fail data read out of the failure analysis memory;
- performing recovery analysis processing based on the ORed result; and
- if the recovery analysis processing based on the ORed result indicates recovery is not possible, performing the recovery analysis processing bit by bit for each of the plurality bits indicating a fail.

8. The memory failure recovery analysis method as recited in claim 7 that comprises:
- performing at least once the recovery analysis processing based on the result of ORing of the plural bits of the fail data; and
- performing the recovery analysis processing for all bits of said fail data by at least one or more repetitions of the recovery analysis processing.

9. The memory failure recovery analysis method as recited in claim 7 or 8 that comprises:
- reading out fail data from the failure analysis memory at arbitrarily designated addresses; and
- designating an arbitrary bit in the read-out fail data and deciding whether the designated bit is fail data.

* * * * *

UNITED STATES PATENT AND TRADEMARK OFFICE
CERTIFICATE OF CORRECTION

| | | |
|---|---|---|
| PATENT NO. | : 7,054,788 B2 | Page 1 of 1 |
| APPLICATION NO. | : 10/399368 | |
| DATED | : May 30, 2006 | |
| INVENTOR(S) | : Masahiro Akutsu | |

It is certified that error appears in the above-identified patent and that said Letters Patent is hereby corrected as shown below:

Title Page, at INID code Item (57) the Abstract,

"The invention relates to a hydraulic ratchet wrench with a double-action hydraulic cylinder piston drive with a gear pump (20) and a piston pump (21). According to the invention, a working stroke and a return stroke are controlled through a reversal of rotational direction of a pump motor (4), whereby the necessary flow volume is produced automatically via internal flow control valves, and without additional valve controls."

should be

-- In the test of a memory all data bit of fail data, which is output from a logic comparator, are stored in a failure analysis memory AFM; and at the time of recovery processing, bit designating data for designating plural bits in the fail data are read out of a bit designating memory 21D, the read-out bit designating data is used to take out of gates 21B-0 to 21B-N-1 the designated bits in each fail data read out of the failure analysis memory AFM, these pieces of bit data thus obtained are ORed, and based on the results of ORing, the recovery analysis processing.--

Signed and Sealed this

Twenty-fourth Day of October, 2006

JON W. DUDAS
*Director of the United States Patent and Trademark Office*